(12) United States Patent
Trimberger

(10) Patent No.: US 7,143,332 B1
(45) Date of Patent: Nov. 28, 2006

(54) METHODS AND STRUCTURES FOR PROVIDING PROGRAMMABLE WIDTH AND ERROR CORRECTION IN MEMORY ARRAYS IN PROGRAMMABLE LOGIC DEVICES

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 485 days.

(21) Appl. No.: 10/737,280

(22) Filed: Dec. 16, 2003

(51) Int. Cl.
*G11C 20/00* (2006.01)

(52) U.S. Cl. .................. 714/763; 714/758; 365/200; 365/20; 360/26; 360/47

(58) Field of Classification Search .............. 714/763, 714/758; 365/200, 201; 360/26, 47
See application file for complete search history.

(56) References Cited

U.S. PATENT DOCUMENTS 6,167,491 A * 12/2000 McAlpine ................. 711/149
6,253,299 B1 * 6/2001 Smith et al. ............... 711/171
6,662,334 B1 * 12/2003 Stenfort ..................... 714/769
6,941,505 B1 * 9/2005 Yada et al. ................. 714/763

OTHER PUBLICATIONS

Xilinx, Inc.; "Virtex-II Pro Platform FPGA Handbook"; published Oct. 14, 2002; available from Xilinx, Inc., 2100 Logic Drive, San Jose, California 95124; pp. 19-71.

* cited by examiner

*Primary Examiner*—Albert Decady
*Assistant Examiner*—Esaw Abraham
(74) *Attorney, Agent, or Firm*—Lois D. Cartier

(57) ABSTRACT

A random access memory (RAM) in a programmable logic device (PLD) supports error correction as well as a configurable data width. The number of bits in a user data word varies by the selected configuration of the RAM, while the number of bits in the error correction code (ECC) is unvarying, and is based on the total width of the memory. In some embodiments, separate ports are provided for the user data and the ECC data. Thus, ECC data can be written to an ECC portion of the RAM array at a given RAM address, while at the same time user data is written to or read from a configurable user data portion of the RAM array at the same RAM address. In other embodiments, a single memory access port is used for both user data and ECC data.

18 Claims, 12 Drawing Sheets

METHODS AND STRUCTURES FOR PROVIDING PROGRAMMABLE WIDTH AND ERROR CORRECTION IN MEMORY ARRAYS IN PROGRAMMABLE LOGIC DEVICES

FIELD OF THE INVENTION

The invention relates to random access memory (RAM) structures in programmable logic devices (PLDs). More particularly, the invention relates to PLD RAM structures having both programmable width and error correction capabilities.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of configurable logic blocks (CLBs) and programmable input/output blocks (IOBs). The CLBs and IOBs are interconnected by a programmable interconnect structure.

Advanced FPGAs can include other types of logic blocks in the array in addition to the CLBs and IOBs. For example, the Xilinx Virtex-II Pro™ FPGA includes blocks of Random Access Memory (RAM), blocks implementing multiplier functions, and embedded processor blocks. (The Xilinx Virtex-II Pro FPGA is described in detail in pages 19–71 of the "Virtex-II Pro Platform FPGA Handbook", published Oct. 14, 2002 and available from Xilinx, Inc., 2100 Logic Drive, San Jose, Calif. 95124, which pages are incorporated herein by reference.)

The interconnect structure, CLBs, IOBs, and other logic blocks (e.g., RAM blocks) are typically programmed by loading a stream of configuration data into internal configuration memory cells that define how the logic blocks and interconnect are configured. The configuration data can be read from memory (e.g., an external PROM) or written into the FPGA by an external device. The collective states of the individual memory cells then determine the function of the FPGA.

In many PLDS, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell. Other PLDs are programmed by applying a processing layer, such as a metal layer, that programmably interconnects the various elements on the device. These PLDs are known as ASIC devices (Application Specific Integrated Circuits). PLDs can also be implemented in other ways, e.g., using fuse or antifuse technology.

The programmable RAM blocks included in some PLDs serve many purposes. For example, programmable RAM blocks can be used as FIFOs (first-in, first-out data storage circuits) to improve data communications between the PLD and other integrated circuits or systems. As another example, data can be stored in the programmable RAM blocks as part of the PLD configuration process, then accessed as necessary to provide (for example) execution instructions for an embedded processor.

RAM blocks in PLDs can take advantage of the programmable nature of the devices to offer more flexibility to system designers. For example, some PLD RAM blocks are configurable with regard to length and width. The Virtex-II Pro Block SelectRAM+ memory block, for example, can be programmed in various depth and width configurations varying from 16K words by 1 bit to 512 words by 36 bits. The Virtex-II Pro Block SelectRAM+ memory block is described, for example, in pages 58–61 of the "Virtex-II Pro Platform FPGA Handbook", referenced above.

A common method of implementing error correction in a non-configurable RAM is to add an "error correcting code" (ECC) to each word in the RAM array. The ECC provides an encoded version of the entire memory word stored at the same address in the memory, where the memory word includes both the user data and the ECC data. During each write operation to the block RAM, the encoded ECC is generated and stored along with the RAM data. The ECC can include, for example, a Hamming code representation of the memory word. When a Hamming code is used, an ECC of log2(N)+1 bits (rounded up to the nearest integer) can detect a single error in a memory word of N bits, and report the location of the erroneous bit. The same ECC can also detect the presence of two errors in a memory word of N bits, but cannot report the location of the errors.

During a read operation at the same address, the ECC is recomputed based on the data read from the memory (the read data). The recomputed ECC and the read data are used to determine whether or not an error has occurred in the read data, and also which bit of the read data is in error. Making use of the fact that each bit has only two possible states, the data is corrected by simply flipping the bit that has been identified as the erroneous bit. All of these techniques are well-known in the art of RAM design.

FIG. 1 is a simple block diagram of a well-known non-configurable RAM having error correction capability based on a Hamming code. Each row of N memory cells (each memory word) includes one user data word of M bits plus (log2(N)+1) ECC bits. In the illustrated RAM, each memory word is 13 bits wide (N=13), each user data word is 8 bits wide (M=8), and the ECC data includes 5 bits (log2(13)+1=5). While N and M can be much larger numbers, values of 13 and 8 are used in this example, for clarity.

When PLD memory cells are subjected to unusual conditions such as cosmic rays or bombardment by neutrons or alpha particles, a static memory cell can change state. For example, a stored high value can be inadvertently changed to a low value, and vice versa. These "single event upsets" can corrupt the contents of a PLD block RAM. If error correction were available in configurable PLD block RAM, the effects of these single event upsets could be detected and optionally repaired. Therefore, it is clearly desirable to provide error correction in the configurable RAM blocks of PLDs.

SUMMARY OF THE INVENTION

The invention provides a random access memory (RAM) in a programmable logic device (PLD) that supports error correction as well as a configurable data width, as well as methods of utilizing such memories. The number of bits in a user data word varies by the selected configuration of the RAM, while the number of bits in the error correction code (ECC) is unvarying, and is based on the total width of the memory. In some embodiments, separate ports are provided for the user data and the ECC data. Thus, ECC data can be written to an ECC portion of the RAM array at a given RAM address, while at the same time user data is written to or read from a configurable user data portion of the RAM array at the same RAM address. In other embodiments, a single memory access port is used for both user data and ECC data.

BRIEF DESCRIPTION OF THE DRAWINGS

The present invention is illustrated by way of example, and not by way of limitation, in the following figures.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 1:
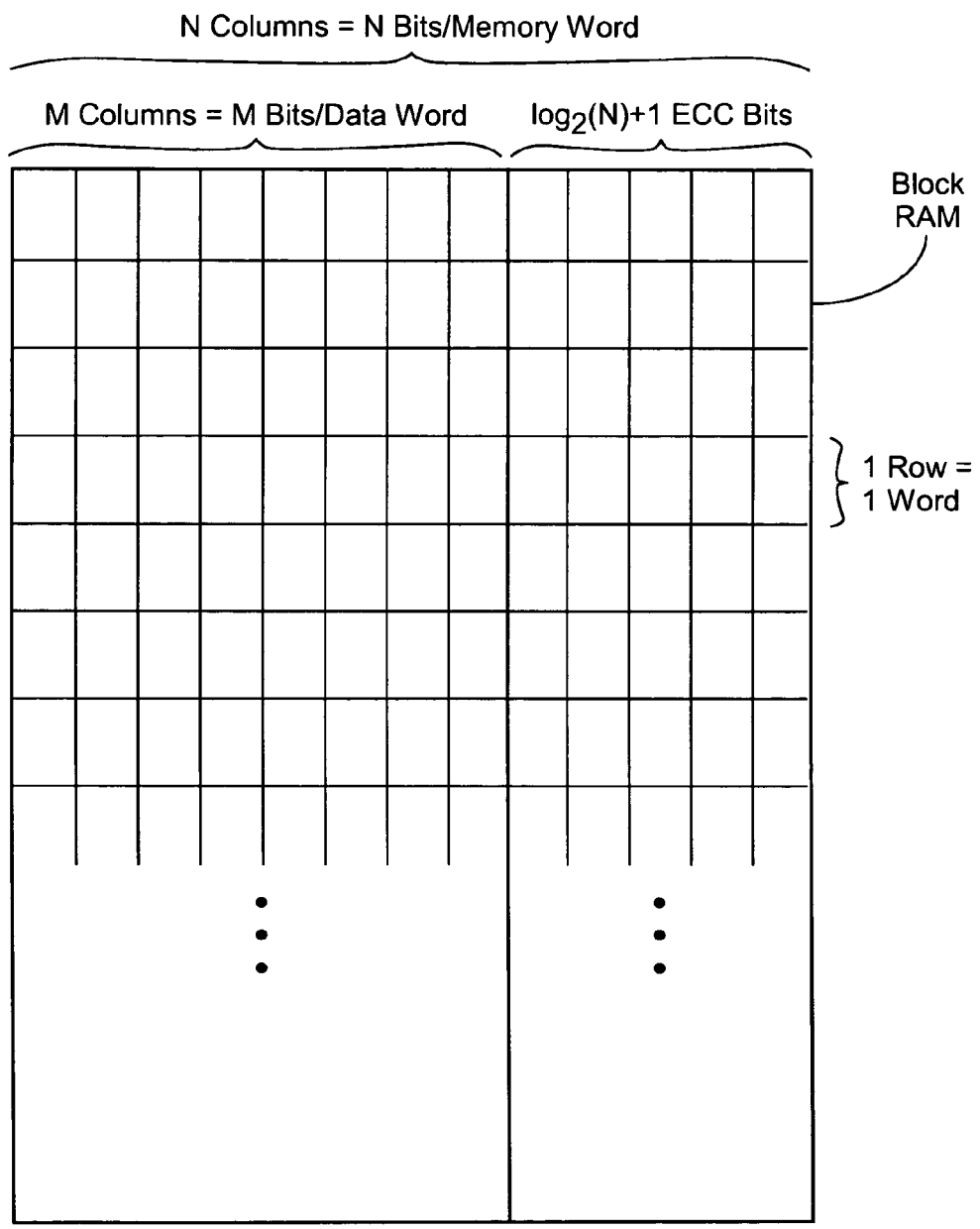
FIG. 1 is a block diagram illustrating a known non-configurable RAM structure having error correction capability.
Figure 2:
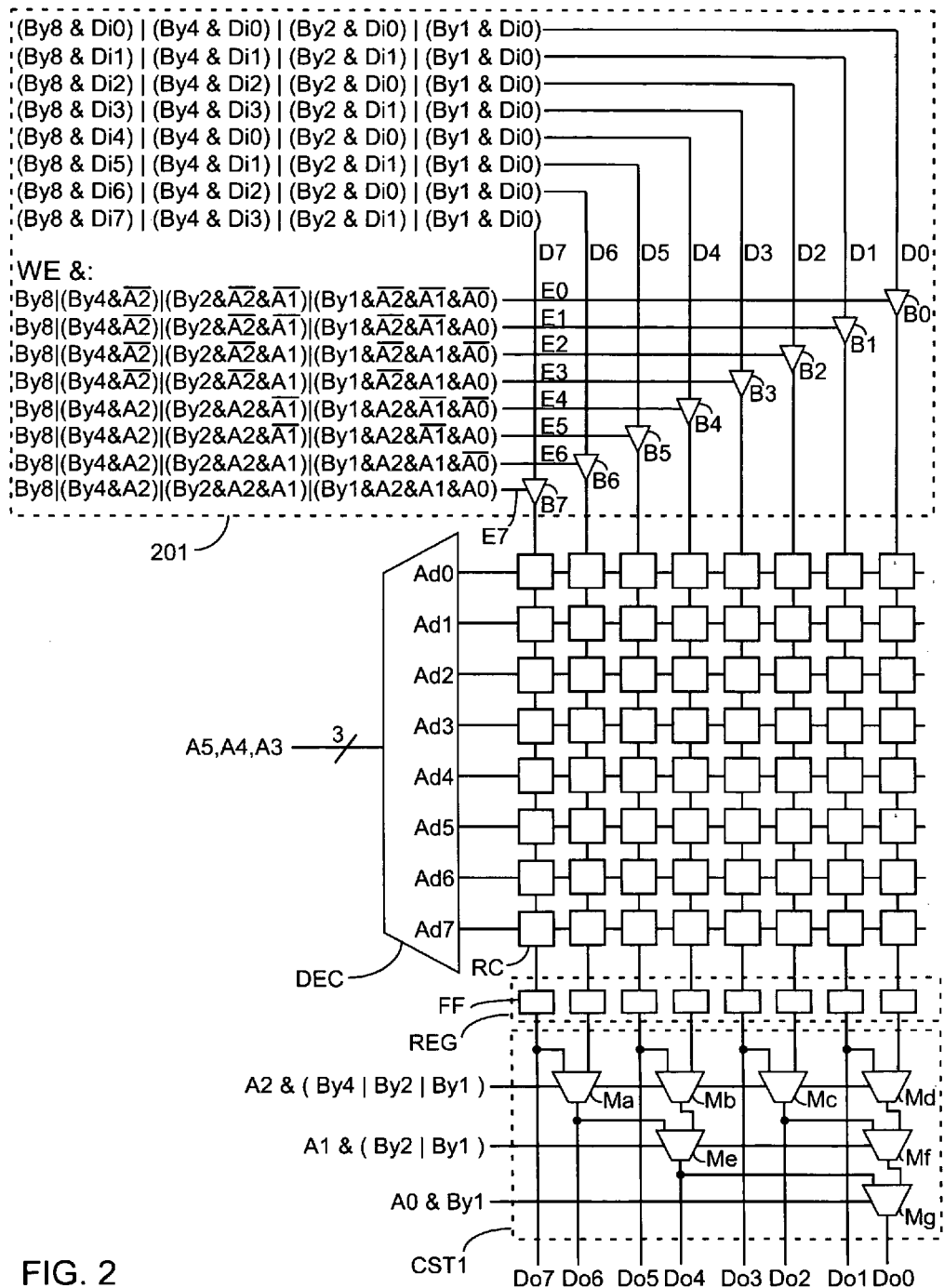
FIG. 2 illustrates a first configurable RAM structure without error correction capability.

FIG. 2 illustrates a configurable RAM structure that does not have error correction capability. The configurable RAM structure of FIG. 2 could be included, for example, in a programmable logic device (PLD) such as a field programmable gate array (FPGA). The memory array of FIG. 2 stores a user data word having a maximum width of eight bits, but can be configured to store user data words having widths of 8 bits, 4 bits, 2 bits, or 1 bit. (Thus, the memory array has four optionally selected "virtual widths".) Memory arrays included in FPGAs are typically much larger, but a smaller array provides a clearer illustration and understanding of the structures involved. The principles and structures illustrated in the examples herein can easily be extended to larger arrays by those of skill in the relevant arts.

The configurable RAM structure shown in FIG. 2 includes an eight-by-eight array of RAM cells RC. The RAM array is addressed by a decoder DEC, which accepts three address bits A5, A4, A3 and decodes the address bits into eight word lines Ad7–Ad0 for the RAM cells RC. Data is written to the RAM array via write port 201 and a plurality of vertical bit lines. Data is read from the RAM array via the vertical bit lines into a register REG that includes eight flip-flops FF. The registered data passes into configurable select tree CST1, where some or all of the bits are selected as output signals from the RAM array. In some embodiments, register REG is omitted.

Configurable select tree CST1 includes seven 2-to-1 multiplexers Ma–Mg, which are controlled by three address signals A2–A0 and three configuration select signals By4, By2, By1. Signal By8 is also provided to the configurable RAM structure, but is not needed in configurable select tree CST1. Only one of configuration select signals By8, By4, By2, By1 is high at any given time. The high signal selects the virtual data width for the user data word, e.g., signal By8 selects an 8-bit virtual width, signal By4 selects a 4-bit virtual width, and so forth. Multiplexers Ma–Mg are configured to provide eight, four, two, or one output signals depending on which of signals By8, By4, By2, By1 is high. Which bits are provided as output signals Do7–Do0 from the RAM array depends on the values of address signals A2, A1, and A0. (In the present specification, the same reference characters are used to refer to terminals, signal lines, and their corresponding signals.)

Write port 201 includes a series of tristate drivers or buffers B7–B0. The fact that the tristate drivers B7–B0 are selectively enabled means that, when desired, only selected bits of a word can be written to the RAM array. The tristate drivers B7–B0 selectively drive data values D7–D0, respectively, onto the bit lines of the RAM array. Which of tristate drivers B7–B0 are enabled depends on the values of enable signals E7–E0, respectively.

User input data to the RAM is designated Di7–Di0 in FIG. 2. The selection of which input data bits Di7–Di0 to provide to the tristate drivers B7–B0 depends on the selected virtual width. For example, data D7 to be provided to tristate driver B7 can be either signal Di7 (if a virtual width of eight is selected, i.e., signal By8 is high), signal Di3 (if signal By4 is high), signal Di1 (if signal By2 is high), or signal Di0 (if signal By1 is high). Therefore, as shown in FIG. 2, signal D7 can be generated by implementing the equation:

$$D7=(By8\&Di7)|(By4\&Di3)|(By2\&Di1)|(By1\&Di0)$$

where the symbol "|" denotes a logical OR operation and the symbol "&" denotes a logical AND operation.

The equations for data signals D6–D0 can be similarly derived, and are shown in FIG. 2. Note that in some cases these equations can be considerably simplified, as in the case of signal D0:

$$D0=(By8\&Di0)|(By4\&Di0)|(By2\&Di0)|(By1\&Di0)$$

which can be simplified to the equation:

$$D0=Di0.$$

However, the full equations are shown in the figures herein, for clarity. The simplification of the equations is a simple matter for those of skill in the relevant arts.

The equations shown herein can be implemented in various ways. For example, when the configurable RAM structure of FIG. 2 is part of an FPGA, some equations can be implemented either by using configurable logic blocks in the FPGA, or simply by using the configurable routing structure. In other words, the values of signals By8, By4, By2, and By0, once selected, are static. Therefore, these signals can be simplified out of the equations, often leaving a simple connection that can be made through the configurable routing structure.

The selection of which tristate drivers B7–B0 to enable during a write operation to the RAM array depends not only on the selected virtual width, but also on which configurable subset of the RAM array is being addressed. Therefore, each of enable signals E7–E0 is only high when the write enable signal WE for the RAM array is high and when an equation is satisfied that selects the associated vertical bit line based on the values of configuration select signals By8, By4, By2, By1 and address signals A2, A1, A0.

FIG. 2 shows the equations for each enable signal E7–E0. For example, enable signal E7 for tristate driver B7 will always be high if a virtual width of eight is selected (i.e., signal By8 is high). Enable signal E7 will also be high if a virtual width of four is selected and the leftmost four bits are addressed by address signal A2 (i.e., signals By4 and A2 are both high). Enable signal E7 will also be high if a virtual width of two is selected and the leftmost two bits are selected (i.e., signals By2, A2, and A1 are all high), or if a virtual width of one is selected and the leftmost bit is selected (i.e., signals By1, A2, A1, and A0 are all high). Therefore, the equation for signal E7 is as follows:

$$E7=WE\&[By8|(By4\&A2)|(By2\&A2\&A1)|(By1\&A2\&A1\&A0)]$$

where the symbol "|" denotes a logical OR operation and the symbol "&" denotes a logical AND operation. The equations for signals E6–E0 can be similarly derived, and are shown in FIG. 2.

Figure 2A:
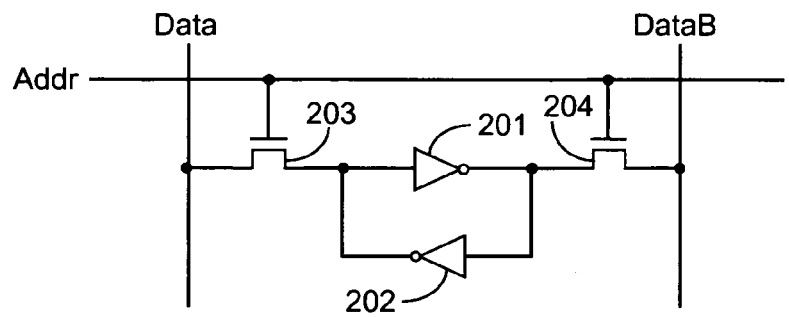
FIG. 2A illustrates a known single-port RAM cell.

Any known type of memory cell can be used in the configurable RAM circuit of FIG. 2. FIG. 2A shows an exemplary RAM cell that can be used in the configurable RAM circuit of FIG. 2. The RAM cell of FIG. 2A includes two cross-coupled inverters 201, 202, with the output of each inverter coupled to a data terminal of an associated pass transistor 204, 203, respectively. The pass transistors can be N-channel transistors, as shown in FIG. 2A, or CMOS pass gates. The pass transistors are gated by a horizontal word line Addr. Vertical bit lines Data and DataB are coupled respectively to data terminals of pass transistors 203 and 204.

Data is written from vertical bit lines Data and DataB into the RAM cell whenever word line Addr is high and the associated enable signal En is high, because tristate drivers B7–B0 are sized to overcome inverters 201, 202, i.e., to overwrite the value previously stored in the RAM cell. Data is read from the RAM cell onto the vertical bit lines Data and DataB (and hence to register REG) whenever word line Addr is high and the associated enable signal En is low.

Note that the RAM cell of FIG. 2A includes both true and complement bit lines (Data and DataB), while FIG. 2 illustrates only a single bit line for each column in the RAM array. One of the two bit lines (e.g., DataB) and the associated pass transistor (e.g., 204) can be omitted in the RAM cell of FIG. 2A. Alternatively, both bit lines and pass transistors can be included, and the second bit line can be added to each column of the RAM array in FIG. 2. In some RAM cells having two bit lines, one bit line is used for writing and the other for reading. The complementary bit lines are omitted from the various figures herein, to improve the clarity of the illustrations.

Figure 2B:
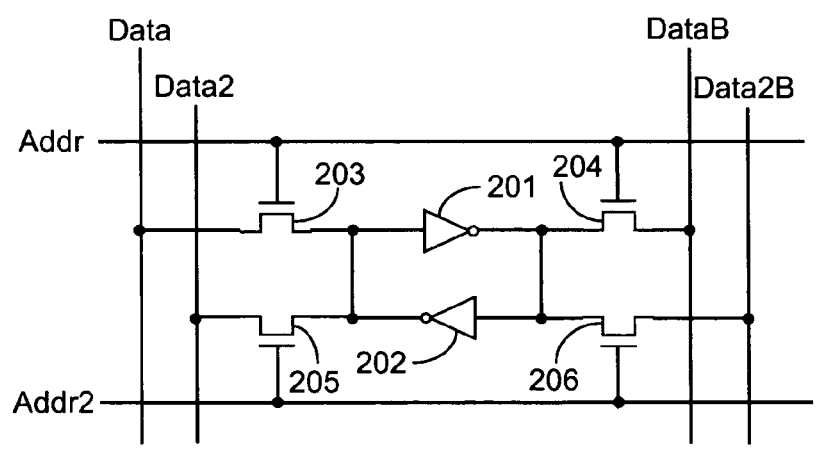
FIG. 2B illustrates a known dual-port RAM cell.

FIG. 2B illustrates another known RAM cell, a dual-port RAM cell. The RAM cell of FIG. 2B can be used in the embodiment of FIG. 9, which includes multiple read and write ports. To provide a second read and write port, a second word line Addr2 and additional pass transistors 205, 206 and bit lines Data2, Data2B are added to the circuit of FIG. 2A.

Figure 3:
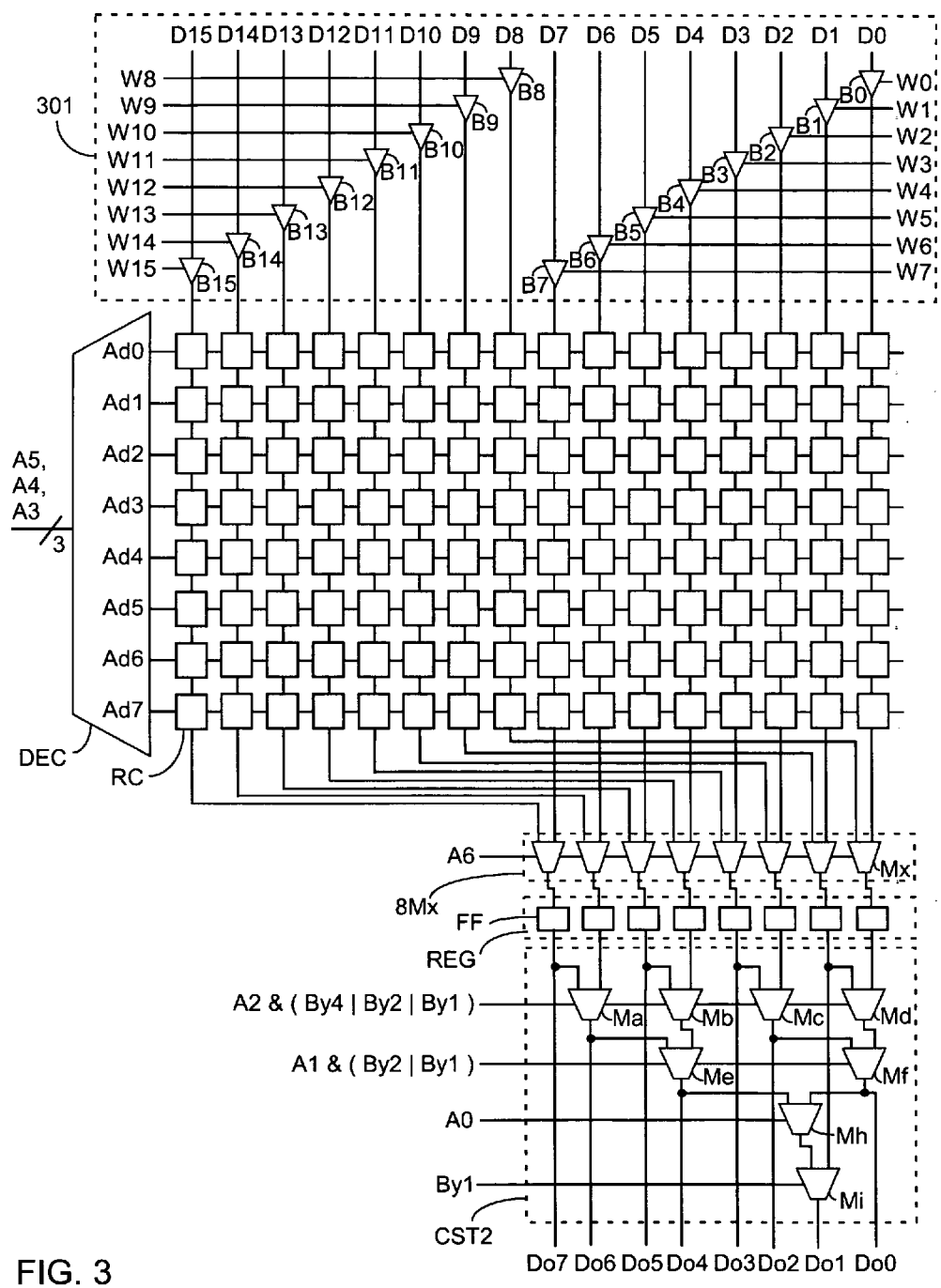
FIG. 3 illustrates a second configurable RAM structure without error correction capability.

FIG. 3 illustrates another configurable RAM structure without error correction capability. The configurable RAM structure of FIG. 3 is similar to the RAM structure of FIG. 2, but has twice the capacity, i.e., the memory word width is 16 bits. However, the maximum user data word width is still eight bits. The added capacity is made available by adding another address line A6 that selects between the leftmost eight bits and the rightmost eight bits in the RAM array.

Write port 301 includes 16 tristate drivers B15–B0 driving 16 vertical bit lines. Tristate drivers B15–B0 are enabled by enable signals W15–W0. Enable signals W7–W0 are related to enable signals E7–E0 (see FIG. 2) as follows: Wn=!A6&En, where !A6 is the complement of address signal A6 and the symbol "&" denotes the logical AND operation. Enable signals W15–W8 are related to enable signals E7–E0 as follows: Wn=A6&E(n−8).

The read port of the RAM structure of FIG. 3 includes a set 8Mx of eight 2-to-1 multiplexers Mx that selects between the leftmost eight bits and the rightmost eight bits of the RAM array. Multiplexers Mx are controlled by address signal A6, with a high value on signal A6 selecting the leftmost eight bits of the RAM array, and a low value on signal A6 selecting the rightmost eight bits of the RAM array.

FIG. 3 also illustrates a variation on the configurable select tree. Configurable select tree CST2 of FIG. 3 differs from configurable select tree CST1 of FIG. 2 in that the multiplexers have been rearranged and augmented to more nearly balance the delays in most bit-width configurations. Multiplexer Mg is removed from the path providing RAM array output signal Do0, leaving only two multiplexers (Md and Mf) on that path. Added multiplexer Mh now selects between the outputs of multiplexers Me and Mf, while added multiplexer Mi selects between the output of multiplexer Mh and the bit line second from the right.

Configurable select tree CST2 still provides eight, four, two, or one output signals. The By1 mode output now appears at terminal Do1 instead of at terminal Do0. However, at the expense of a longer delay in By1 mode (traversing a maximum of four multiplexers instead of three), all other modes now have a shorter delay, with the output bits traversing at most two multiplexers instead of three as in FIG. 2.

Figure 4:
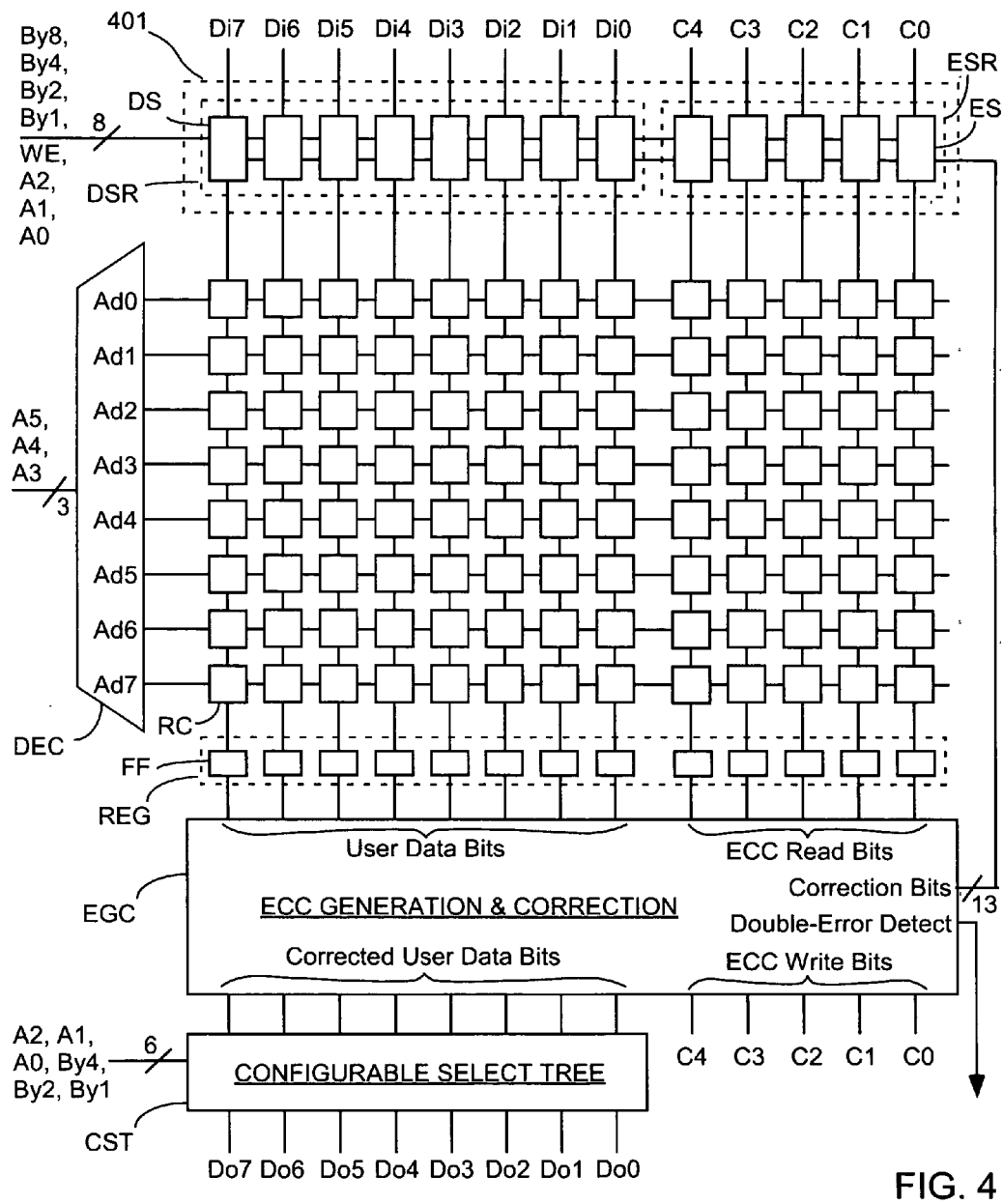
FIG. 4 illustrates a first configurable RAM structure having error correction capability.

FIG. 4 illustrates a RAM structure providing both a configurable user data word width and error correction capability. The configurable RAM structure of FIG. 4 could be included, for example, in a programmable logic device (PLD) such as a field programmable gate array (FPGA). The memory array of FIG. 4 stores a user data word having a maximum width of eight bits, but can be configured to store user data words having widths of 8 bits, 4 bits, 2 bits, or 1 bit. The principles and structures illustrated in FIG. 4 can easily be extended to larger RAM arrays by those of skill in the relevant arts.

Any known type of memory cell can be used in the configurable RAM circuit of FIG. 4. For example, the RAM cell of FIG. 2A can be used. As described in connection with FIG. 2A, the complement bit lines (DataB) are omitted in FIG. 4, for clarity.

The configurable RAM structure shown in FIG. 4 includes an 8-by-13 array of RAM cells RC. The 8-by-8 array includes a user data portion (the leftmost 8-by-8 array) and an ECC data portion (the rightmost 8-by-5 array). The two portions of the array are addressed by common word lines Ad7–Ad0, but have separate vertical bit lines. The RAM array is addressed by a decoder DEC, which accepts three address bits A5, A4, A3 and decodes the address bits into eight word lines Ad7–Ad0 for the RAM cells RC. Data is written to the RAM array via write port 401. Data (including both user data bits and ECC read bits) is read from the RAM array via the vertical bit lines into an ECC generation and correction circuit EGC.

ECC generation and correction circuit EGC generates corrected data for the user data bits, as well as generating new ECC data. The corrected user data bits are provided to a configurable select tree CST. The new ECC data (ECC write bits C4–C0) are provided to write port 401. In the pictured embodiment, ECC generation and correction circuit EGC also provides 13 correction bits that indicate the location of an erroneous bit, when such a bit is detected. The correction bits are used by write port 401 to write the corrected data to a selected bit of the RAM array, by enabling only the tristate driver of the erroneous bit.

In the pictured embodiment, the well-known Hamming code technique is used to detect erroneous bits. With a user data word of eight bits, a Hamming code of four bits can detect an error and pinpoint the erroneous bit within the total 12-bit-wide memory word. With the same user data word of eight bits, a Hamming code of five bits can detect a single error and pinpoint the erroneous bit within the 13-bit memory word, and can also detect a second error, but cannot pinpoint the location of the second error. Therefore, in the pictured embodiment ECC generation and correction circuit EGC also provides a "double-error detect" output signal. The double-error detect output signal indicates that more than one erroneous bit was detected, i.e., that an uncorrectable error condition was detected.

In other embodiments (not shown), the corrected user data is provided as an output Do7–Do0 of the RAM array, but the corrected data is not stored in the RAM array. In some embodiments, a "single-error detect" signal is provided that indicates the presence of an erroneous bit in the RAM array.

Configurable select tree CST provides RAM array output signals Do7–Do0, under the control of address signals A2–A0 and three configuration select signals By4, By2, and By1. Configurable select tree CST can be implemented, for example, as shown in FIG. 2 (CST1) or FIG. 3 (CST2).

Write port 401 includes two portions, a data select register portion DSR and an ECC select register portion ESR. Data select register DSR is used to write user data to the RAM array, and also (in some embodiments) to write corrected user data to the RAM array. ECC select register ESR is used to write newly generated ECC data to the RAM array, and also (in some embodiments) to write corrected ECC data to the RAM array.

Figure 5:
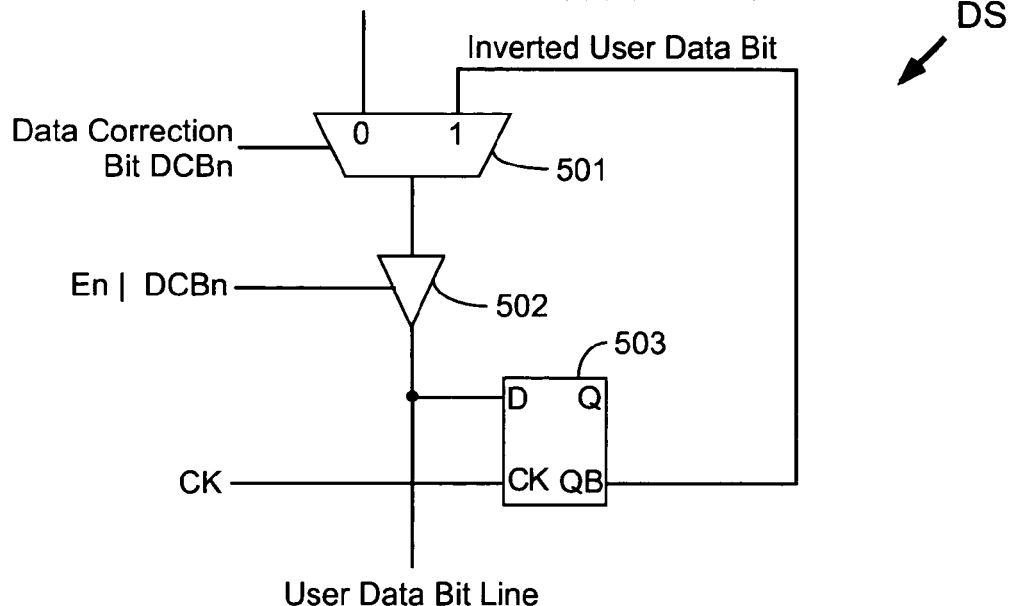
FIG. 5 illustrates a data select cell that can optionally be included in the write port of the RAM structure shown in FIG. 4.

FIG. 5 illustrates one embodiment of one bit DS of data select register DSR. Under control of the associated data correction bit DCBn, multiplexer 501 selects between data value Dn (see FIG. 2) and the inverted user data bit from the RAM array, as registered in flip-flop 503. In some embodiments, flip-flop 503 is included in write port 401. In other embodiments, flip-flop 503 is the flip-flop FF at the read port, as shown in FIG. 2. The output of multiplexer 501 is provided to tristate driver 502, which is controlled by the OR function of the enable signal En (see FIG. 2) and the associated data correction bit DCBn from the EGC generation and correction circuit EGC (see FIG. 4). When enabled, tristate driver 502 drives the user data bit line associated with the circuit.

Circuit DS functions as follows. When a user data write to the associated bit is in progress, signal DCBn (the associated user data correction bit) is low. Thus, the user data signal Dn is passed through multiplexer 501 to tristate buffer 502. Signal En (the associated enable signal) is high. Therefore, user data signal Dn is driven onto the user data bit line. When a corrected user data write cycle is in progress, signal DCBn is high. Thus, the inverted user data bit from flip-flop 503 is passed through multiplexer 501 to tristate buffer 502. Because signal DCBn is high, tristate buffer 502 drives the inverted user data bit onto the user data bit line, from which the corrected bit value is written to the RAM array at the currently selected address. Note that each value stored in the memory array has only two states. Therefore, to correct an erroneous bit it is only necessary to write an inverted value of the erroneous bit to the same memory location from which the erroneous value was read.

Figure 6:
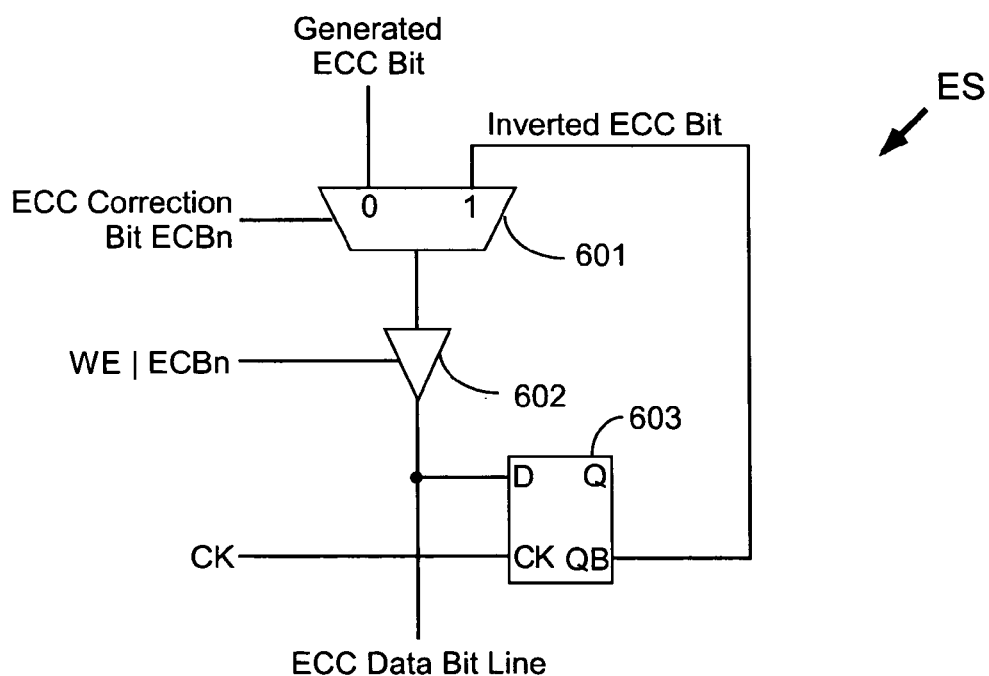
FIG. 6 illustrates an ECC select cell that can optionally be included in the write port of the RAM structure shown in FIG. 4.

FIG. 6 illustrates one embodiment of one bit ES of ECC select register ESR. Under control of the associated ECC correction bit ECBn, multiplexer 601 selects between a newly generated ECC bit (e.g., ECC Write Bits C4–C0 of FIG. 4) and the inverted ECC bit read from the RAM array, as registered in flip-flop 603. In some embodiments, flip-flop 603 is included in write port 401. In other embodiments, flip-flop 603 is included in the ECC generation and correction circuit EGC (see FIG. 4). The output of multiplexer 601 is provided to tristate driver 602, which is controlled by the OR function of the RAM array write enable signal WE (see FIG. 4) and the associated ECC correction bit ECBn from the EGC generation and correction circuit EGC (see FIG. 4). When enabled, tristate driver 602 drives the ECC data bit line associated with the circuit.

Circuit ES functions as follows. When a new ECC write is in progress, signal ECBn (the associated ECC data correction bit) is low. Thus, the newly generated ECC bit is passed through multiplexer 601 to tristate buffer 602. Signal WE (the write enable signal for the RAM array) is high. Therefore, the newly generated ECC bit is driven onto the ECC data bit line. When a corrected ECC write cycle is in progress, signal ECBn is high. Thus, the inverted ECC data bit from flip-flop 603 is passed through multiplexer 601 to tristate buffer 602. Because signal ECBn is high, tristate buffer 602 drives the inverted ECC data bit onto the ECC data bit line, which corrects the erroneous bit.

The embodiment of FIGS. 4–6 utilizes a Hamming code that can correct single-bit errors and detect larger numbers of erroneous bits. However, other types of error correction codes can also be used. For example, in some embodiments (not shown) the ECC includes two full copies of the user data. To check for an error, the ECC generation and correction circuit performs a triple modular redundancy (TMR) check on the user data and the ECC data, comparing all three copies of each bit and assuming that any value different from the other two is incorrect. In these-embodiments, any number of errors in a memory word can be detected and corrected. However, the RAM array is relatively large compared to embodiments that use a Hamming code technique.

The embodiment of FIGS. 4–6 comprises a RAM array that includes a single user data portion and a single ECC portion in each row of memory cells. However, in some embodiments the RAM array is organized in a different fashion, e.g., as shown in FIG. 7.

Figure 7:
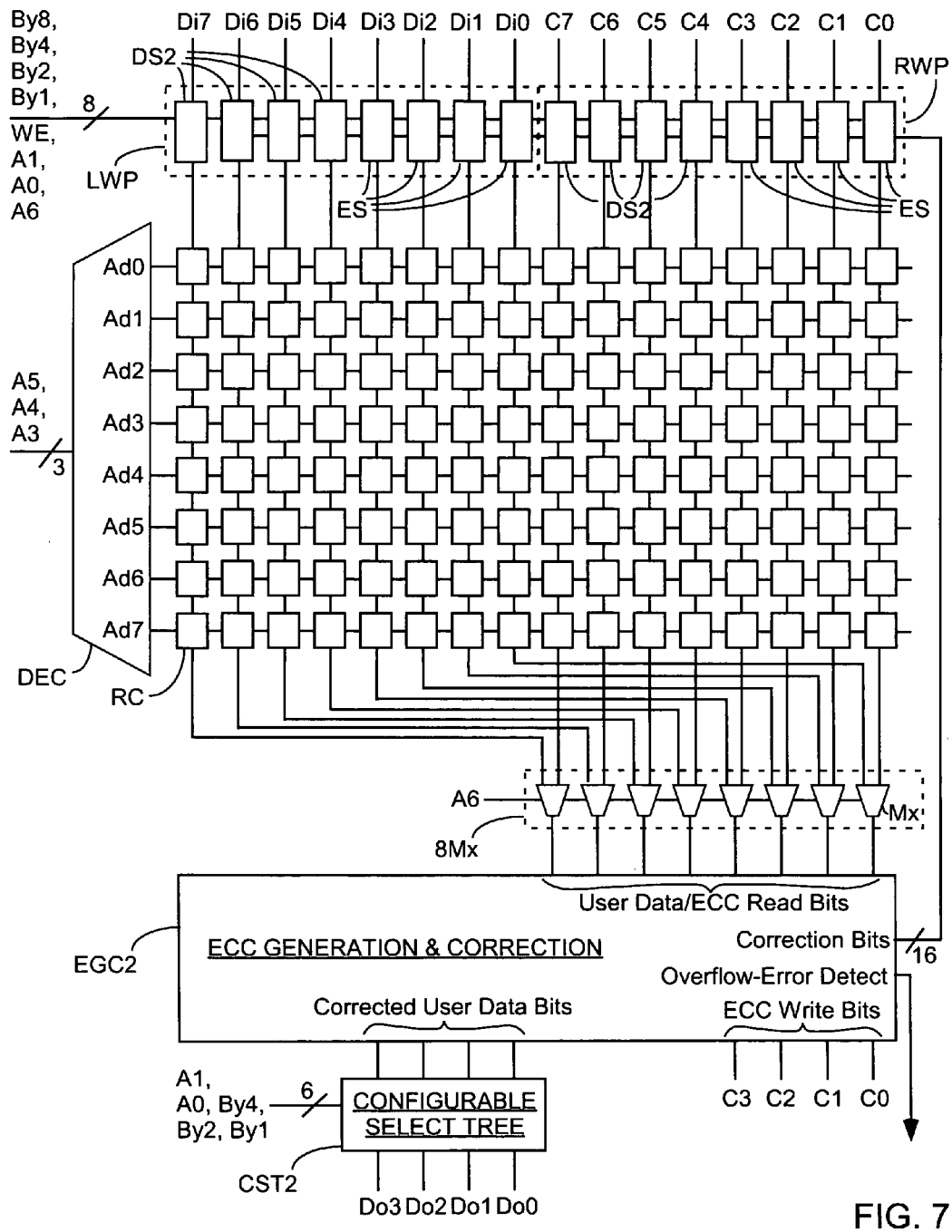
FIG. 7 illustrates a second configurable RAM structure having error correction capability.

In the embodiment of FIG. 7, the memory array has two addressable halves, the leftmost eight bits storing a first user data word and the associated ECC data, and the rightmost eight bits storing a second user data word and the associated ECC data. For example, each half of the RAM array could store a user data word having a maximum width of four bits, but configurable to store user data words having widths of two bits or one bit. The other four bits in each half of the array could be used to store the associated ECC data. Note that the principles and structures illustrated in FIG. 7 can easily be extended to larger RAM arrays by those of skill in the relevant arts. For example, the RAM array can easily be expanded to accommodate two copies of the eight user data bits and five Hamming code ECC bits illustrated in FIG. 4.

Figure 8:
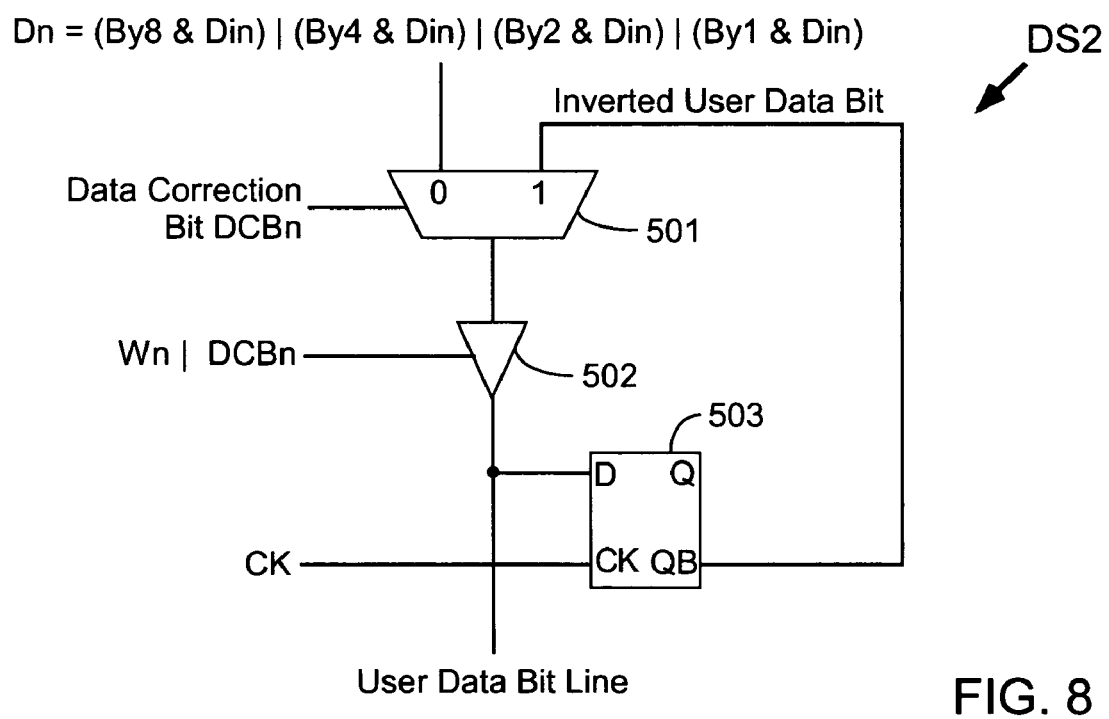
FIG. 8 illustrates a data select cell that can optionally be included in the write port of the RAM structure shown in FIG. 7.

The embodiment of FIG. 7 combines elements from both of FIGS. 3 and 4. As in the structure of FIG. 3, a new address bit A6 is used to multiplex between the left and right halves of the array. Therefore, only one of the two halves can be read or written to at any given time. The left half of the RAM array can be accessed via the left write port LWP, which can include, for example, four copies each of circuits DS and ES of FIGS. 4–6. Similarly, the right write port RWP can include four copies each of circuits DS and ES. However, the DS circuit must take into account the new address line A6. Therefore, as shown in FIG. 8, in the modified DS circuit (DS2) the En signal in FIG. 5 is replaced by signal Wn, which includes a selection based on the value of address signal A6.

Returning to FIG. 7, note that in the pictured embodiment address bit A2 is not needed (due to the reduced maximum number of bits in each user data word) and the ECC generation and correction circuit is simplified to provide only four corrected user data bits and four ECC write bits.

Figure 9:
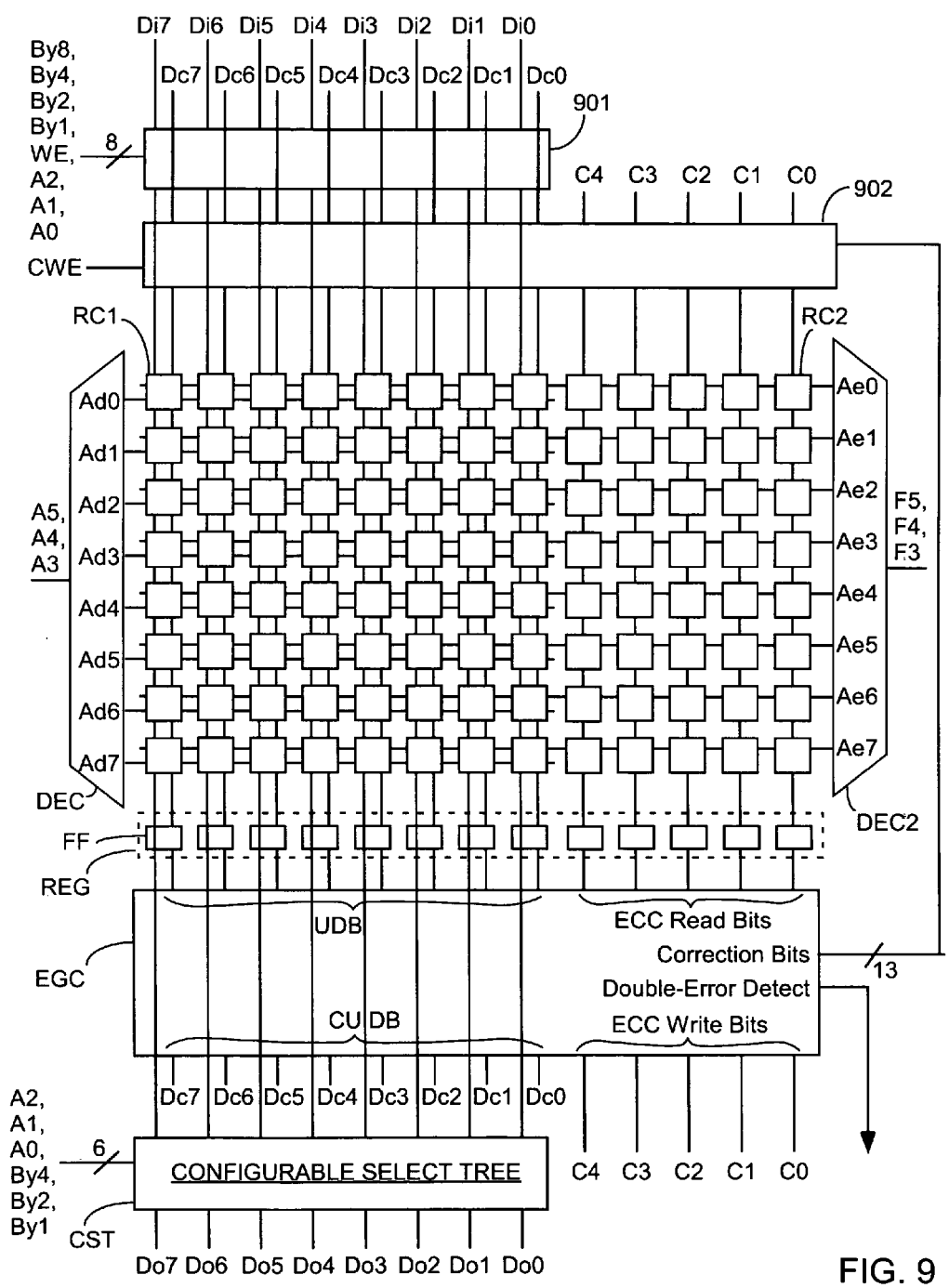
FIG. 9 illustrates a third configurable RAM structure having error correction capability.

FIG. 9 illustrates an embodiment that includes two read ports and two write ports, while providing both a configurable user data word width and error correction capability. By separating the user read and write ports from the ECC correction read and write ports, the user read and write functions are made faster.

For example, in the embodiment of FIG. 9 a user can load all of the user data into the user data portion of the RAM array, then trigger an "ECC generation" cycle for the array. During the ECC generation cycle, the user data word is read from an address in the RAM array, an ECC is computed for the memory word at that address, and the newly generated ECC data is written to the ECC portion of the RAM array at the same address. This series of steps can be performed sequentially for each address in the array, e.g., using a dedicated sequencer included in the ECC generation and correction circuit EGC. Additionally or alternatively, an "ECC correction" cycle can be run on the array, in which the entire memory word is read, an ECC is computed for the memory word, corrected data is generated for either or both of the user data word and the ECC data, and the corrected data is written into either or both portions of the memory array, as necessary.

The configurable RAM structure of FIG. 9 could be included, for example, in a PLD such as an FPGA. The RAM array of FIG. 9 stores a user data word having a maximum width of eight bits, but can be configured to store user data words having widths of 8 bits, 4 bits, 2 bits, or 1 bit. The principles and structures illustrated in FIG. 9 can easily be extended to larger RAM arrays by those of skill in the relevant arts.

Many known types of memory cells can be used in the configurable RAM circuit of FIG. 9. For example, the dual-port RAM cell of FIG. 2B can be used to implement the user data portion of the RAM array (i.e., RAM cells RC1). Note that the RAM cell of FIG. 2B includes both true and complement bit lines (Data and DataB, Data2 and Data2B), while FIG. 9 illustrates only two bit lines for each column in the user data portion of the RAM array. Either the true or the complement bit lines (e.g., DataB and Data2B) and the associated pass transistors (e.g., 204 and 206) can be omitted in the RAM cell of FIG. 2B. Alternatively, both pairs of bit lines and pass transistors can be included, and the additional bit lines can be added to each column of the RAM array in FIG. 9. The complement bit lines are omitted from FIG. 9, for clarity. Similarly, the RAM cell of FIG. 2A (RC2 in FIG. 9) can optionally be used to implement the ECC data portion of the RAM array (i.e., RAM cells RC2), and the complement bit lines are omitted from FIG. 9, for clarity.

The configurable RAM structure shown in FIG. 9 includes an 8-by-13 array of RAM cells. The 8-by-13 array includes a user data portion (the leftmost 8-by-8 array of RAM cells RC1) and an ECC data portion (the rightmost 8-by-5 array of RAM cells RC2). The user can access the user data portion of the array via a user port, which includes decoder DEC, write port 901, and configurable select tree CST. Note that in the pictured embodiment the address lines Ad7–Ad0 from decoder DEC only access the user data portion of the RAM array. The input signals to the user port include data signals Di7–Di0, and the output signals from the user port include RAM array output signals Do7–Do0.

The ECC generation and correction is performed using an ECC port, which accesses the entire memory word and includes decoder DEC2, write port 902, and ECC generation and correction circuit EGC. Note that in the pictured embodiment the address lines Ae7–Ae0 from decoder DEC2 access all columns of the RAM array, i.e., the entire memory word. The ECC port also includes corrected data signals Dc7–Dc0, ECC write bits C4–C0, and 13 correction bits used by the ECC write port to signify the location of the erroneous bit. The ECC port does not use the low-order address bits for selecting the data width, because the data is always read with the width required for error checking, and only the bits needing correction are written to the RAM array.

Write port 901 can be, for example, the same as write port 201 of FIG. 2. Decoder DEC can be, for example, the same as decoder DEC of FIG. 2. Configurable select tree CST can be, for example, the same as either of configurable select trees CST1 and CST2 of FIGS. 2 and 3, respectively. Write port 902 can be, for example, the same as write port 401 of FIGS. 4–6, but without the option of writing the user bit. Decoder DEC2 can optionally be implemented in the same fashion as decoder DEC. ECC generation and correction circuit EGC can be, for example, the same as the EGC circuit of FIG. 4. Other aspects of the embodiment of FIG. 9 are similar to those of the embodiment pictured in FIG. 4, and are not further described.

Figure 10:
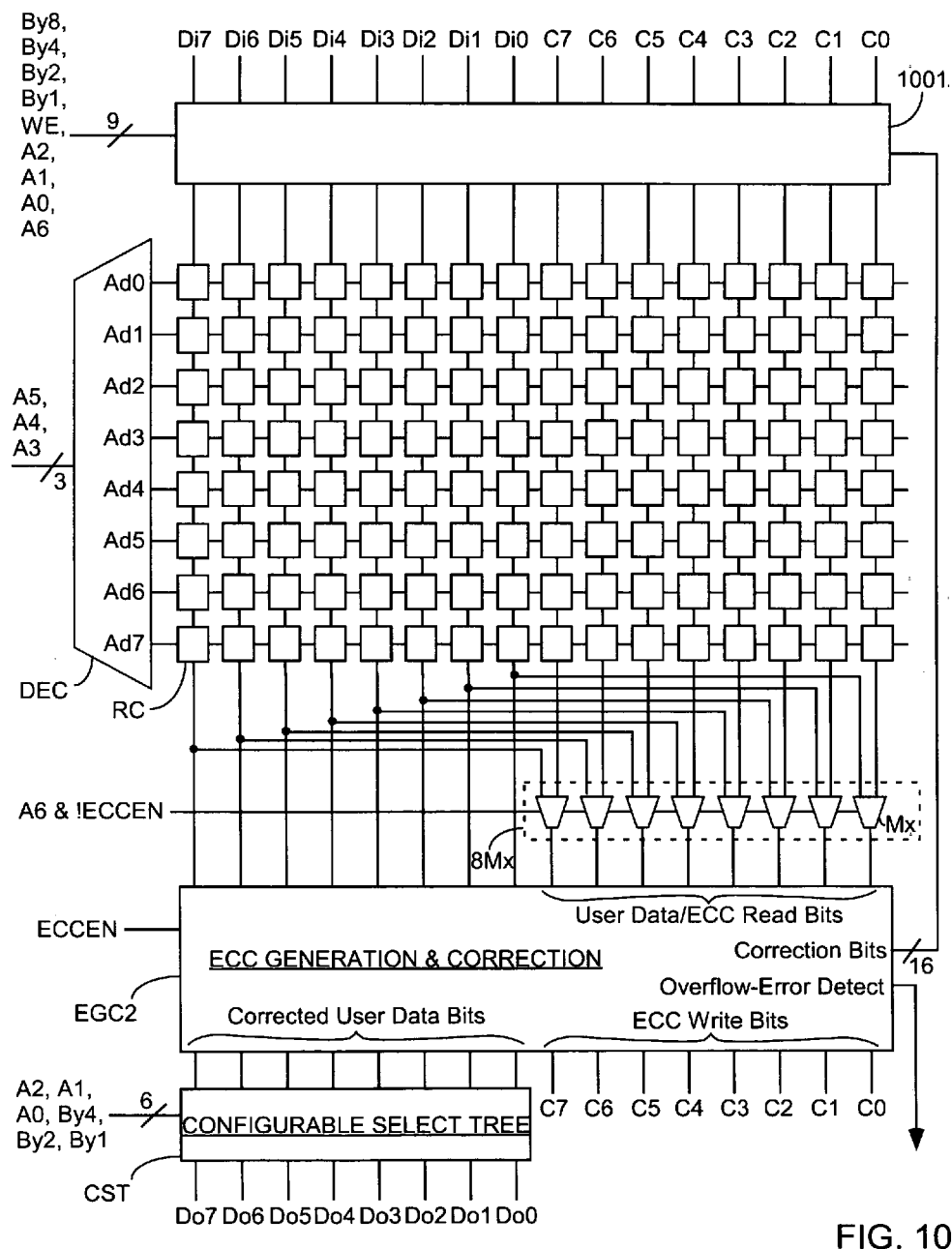
FIG. 10 illustrates a fourth configurable RAM structure having error correction capability.

FIG. 10 illustrates an embodiment that can optionally be configured either to perform error checking and correction, or to provide additional user data storage. In a first mode, the RAM array includes two 8-bit user data words in each memory word (i.e., in each row of RAM cells). In other words, the RAM array includes a first 8-by-8 user data portion in the leftmost half and a second 8-by-8 user data portion in the rightmost half. Each portion has a configurable virtual width, but the two halves have the same virtual width. In a second mode, the RAM array includes an 8-by-8 user data portion in the leftmost half and an 8-by-8 ECC portion in the rightmost half. In each mode, the choice between the two halves of the RAM array is made using an additional address bit A6, e.g., as in the circuits of FIGS. 3 and 7.

The configurable RAM structure of FIG. 10 could be included, for example, in a PLD such as an FPGA. The RAM array of FIG. 10 stores a user data word having a maximum width of eight bits, but can be configured to store user data words having widths of 8 bits, 4 bits, 2 bits, or 1 bit. The principles and structures illustrated in FIG. 10 can easily be extended to larger RAM arrays by those of skill in the relevant arts.

Many known types of memory cells can be used in the configurable RAM circuit of FIG. 10. For example, the RAM cell of FIG. 2A (RC in FIG. 10) can optionally be used to implement each of the memory cells in the RAM array. In the embodiment of FIG. 10, the complement bit lines are present but are omitted from the figure, for clarity. Write port 1001 can be implemented, for example, in a similar fashion to write port 401 of FIG. 4. Decoder DEC can be, for example, the same as decoder DEC of FIG. 2. Configurable select tree CST can be, for example, the same as either of configurable select trees CST1 and CST2 of FIGS. 2 and 3, respectively.

Read multiplexer structure 8Mx can be, for example, the same as multiplexers 8Mx of FIG. 3. However, the multiplexers Mx select between the two halves of the RAM array based not only on address signal A6, but also on an ECC enable signal ECCEN. If signal ECCEN is low (i.e., if signal !ECCEN is high), error correction is disabled, and user data from a selected half of the RAM array (depending on the value of address signal A6) passes to the ECC generation and correction circuit EGC2 via the terminals labeled "User Data/ECC Read Bits". ECC generation and correction circuit EGC2 passes the bits unchanged to the configurable select tree CST. If signal ECCEN is high, error correction is enabled, and all 16 bits from the RAM array are passed to ECC generation and correction circuit EGC2. The eight corrected data bits are passed to the configurable select tree CST, and the ECC write bits are passed to the eight rightmost input terminals C7–C0 of write port 1001. Optionally, the eight corrected data bits are also passed to the Di7–Di0 terminals of write port 1001.

Other aspects of the embodiment of FIG. 10 are similar to those of other embodiments pictured herein, and are not further described.

Figure 11:
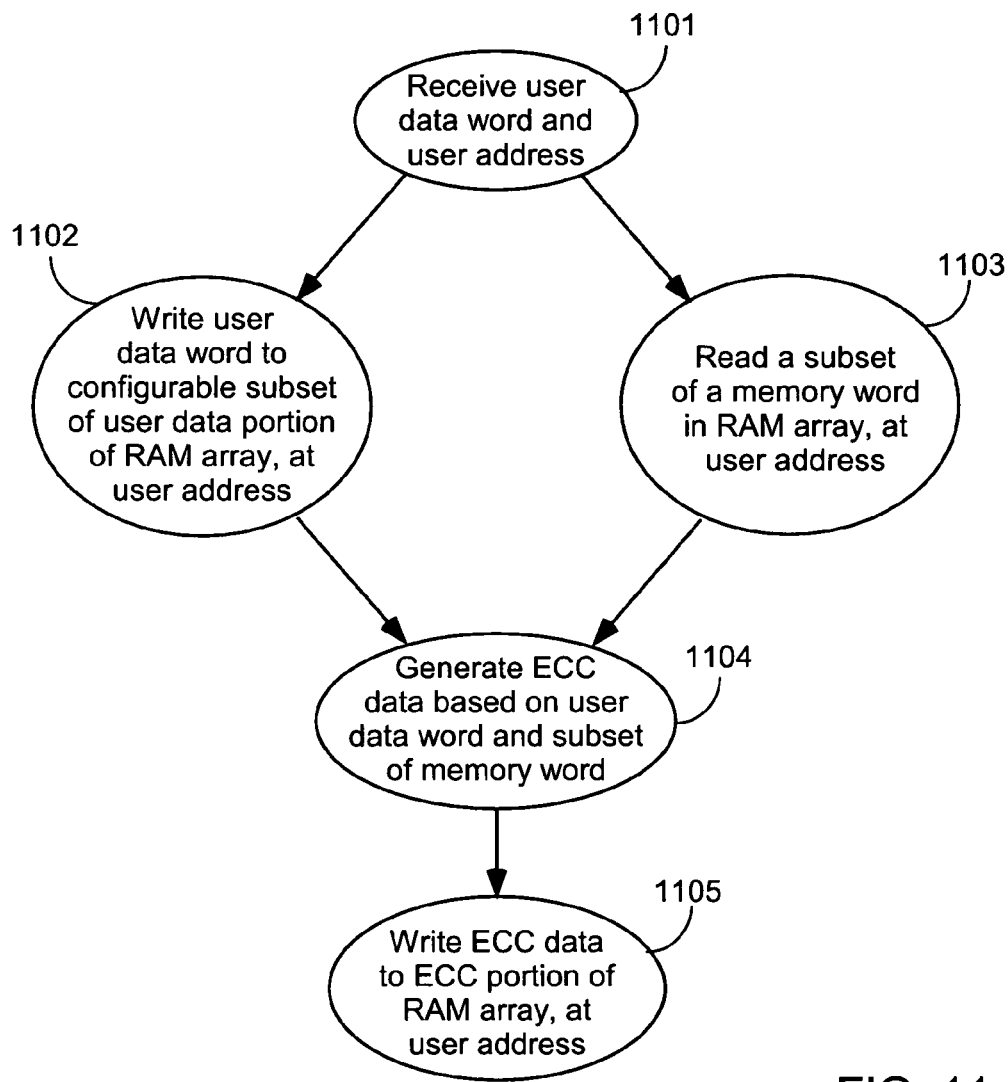
FIG. 11 illustrates the steps of an exemplary method of writing data to a configurable RAM structure having error correction capability.

FIG. 11 illustrates the steps of a first method of utilizing a configurable RAM array in a programmable device. The method of FIG. 11 provides steps for writing user data to a RAM array having a configurable width while also writing ECC data. The RAM array includes a user data portion and an ECC portion. In step 1101, a user data word and a user address are received. The user data word has a selected virtual width that can be the same width as the user data portion, half the width of the user data portion, or some other fraction or subset of the user data portion.

In step 1102, the user data word is written to a configurable subset of the user data portion of the RAM array. The configurable subset might not be a strict subset, in other words, in some configurations the subset can include the entire width of the user data portion of the RAM array. The configurable subset of the user data portion to which the user data word is written is determined by the selected virtual width and the user address received in step 1101.

While writing the user word in step 1102, a subset of a memory word is read from the RAM array in step 1103. The memory word has a non-configurable width. In some embodiments (e.g., the embodiment of FIG. 4), the non-configurable width is the number of bits in a single row of memory cells in the RAM array. In other embodiments (e.g., the embodiment of FIG. 7), the non-configurable width is less than (e.g., half of) the number of bits in a single row of memory cells in the RAM array. Both the user data word written to the RAM array in step 1102 and the subset of the stored memory word read from the RAM array in step 1103 are included in a single stored memory word addressed by the user address received in step 1101. Note that in step 1103 only a subset of the memory word is being read, because some of the memory word is being written at the time of the read, i.e., step 1102 is occurring and the user data word is being written to a configurable subset of the user data portion of the memory word.

In step 1104, ECC data is generated based on the user data word provided in step 1101 and the subset of the stored memory word read in step 1103. In some embodiments, a Hamming code is used to generate the ECC data. In other embodiments, other methods (e.g., generating two copies of the user data for use in a TMR circuit) are used.

In step 1105, the ECC data generated in step 1104 is written to the ECC portion of the RAM at the user address received in step 1101. In some embodiments, steps 1102 and 1105 (i.e., writing the user data word and writing the ECC data) both occur in the same write cycle of the RAM array. In other embodiments, steps 1102 and 1105 occur in different write cycles. In some embodiments, steps 1102 and 1105 both use the same write port, while in other embodiments two different write ports are used.

In some embodiments (not shown), the user data word written to the RAM array in step 1102 is read back from the configurable subset of the user data portion of the RAM array.

In some embodiments, the programmable device is a programmable logic device (PLD) such as a field programmable gate array (FPGA).

Figure 12:
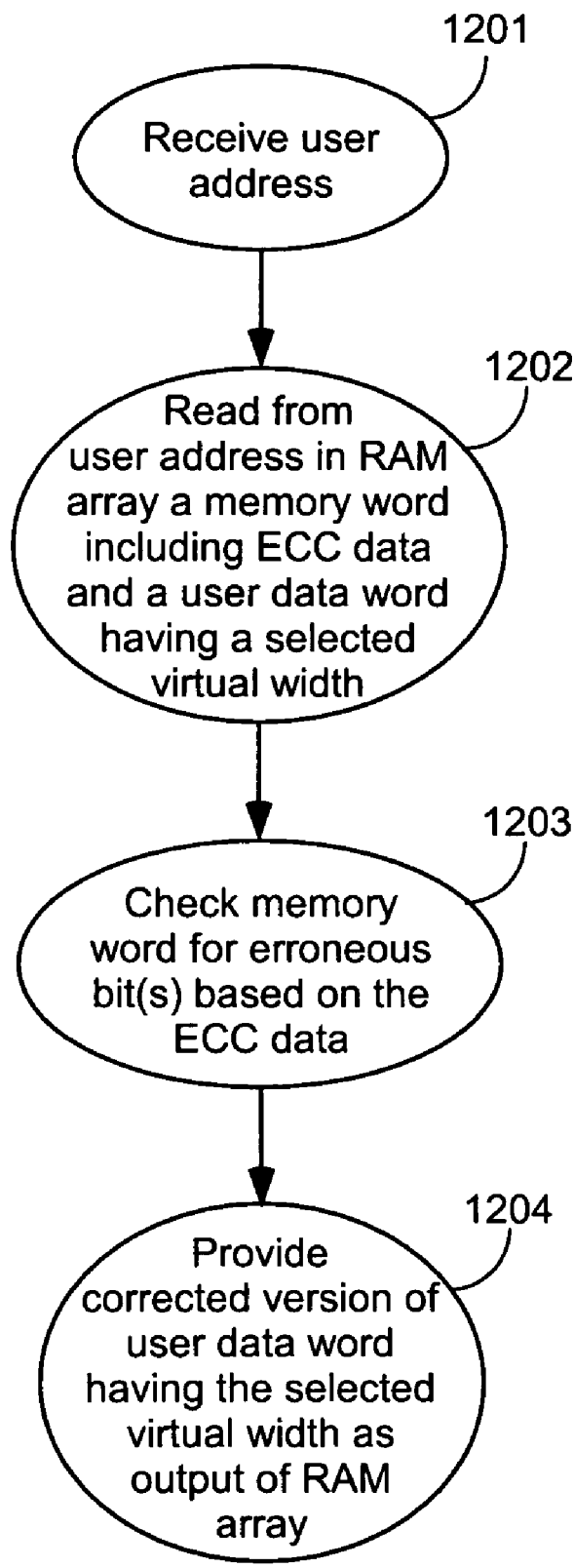
FIG. 12 illustrates the steps of an exemplary method of reading data from a configurable RAM structure having error correction capability.

FIG. 12 illustrates the steps of a second method of utilizing a configurable RAM array in a programmable device. The method of FIG. 12 provides steps for reading user data from a RAM array having a configurable width while performing error correction. The RAM array includes a user data portion and an ECC portion. In step 1201, a user address is received. In step 1202, a memory word is read from the user address in the RAM array. The memory word includes a user data word and associated ECC data. The user data word comprises a configurable subset of the memory word, and has a selected virtual width that can be the same width as the user data portion, half the width of the user data portion, or some other fraction or subset of the user data portion.

In step 1203, the memory word is checked for one or more erroneous bits based on the ECC data. The ECC data can be, for example, a Hamming code based on the values included in the memory word. In other embodiments, the ECC data is another type of code. In one embodiment, the ECC data includes two additional copies of the user data word, and the memory word is checked by performing a TMR check on the user data word and the ECC data.

In some embodiments, if an error is detected while checking the memory word, an error signal is provided that indicates the detection of the error. The error signal can be, for example, a correction bit indicating the location of the error within the memory word. In other embodiments, the error signal is an overflow error detect signal, e.g., indicating the presence of an error that cannot be automatically corrected. For example, in some of the embodiments herein, a single error can be corrected, but a second error in the same memory word cannot be corrected by the circuit.

In some embodiments, if an error is detected while checking the memory word, the erroneous bit in the memory words is corrected by writing a new value to the bit in the RAM array at the user address. For example, where each memory bit has only two possible values, the new value can be written simply by writing a complementary value to the erroneous bit.

In step 1204, a corrected version of the user data word is provided as an output of the RAM array. The corrected version of the user data word has the same virtual width as the selected virtual width of the user data word read from the RAM in step 1202.

In some embodiments, the programmable device is a PLD, e.g., an FPGA.

Those having skill in the relevant arts of the invention will now perceive various modifications and additions that can be made as a result of the disclosure herein. For example, the above text describes the circuits and methods of the invention in the context of programmable logic devices (PLDs) such as field programmable gate arrays (FPGAs). However, the circuits of the invention can also be implemented in other programmable devices and in programmable structures other than PLDs.

Further, random access memories (RAMs), RAM structures, memory cells, RAM cells, memory arrays, RAM arrays, address decoders, flip-flops, registers, drivers, buffers, write ports, read ports, error correction codes (ECCs), ECC methods and structures, configurable select trees, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art. Therefore, it will be apparent to one skilled in the art after reading this specification that the present invention can be practiced within these and other architectural variations.

Accordingly, all such modifications and additions are deemed to be within the scope of the invention, which is to be limited only by the appended claims and their equivalents.

What is claimed is:

1. A method of utilizing a configurable random access memory (RAM) array in a programmable device, the RAM array comprising a user data portion and an error correction code (ECC) portion, the method comprising:
   receiving a user data word and a user address, a number of bits in the user data word varying based on a selected virtual width for the RAM array;
   writing the user data word to a configurable subset of the user data portion of the RAM array, the configurable subset being determined by the selected virtual width and the user address;
   reading, while writing the user data word, from the RAM array at the user address a subset of a stored memory word, the stored memory word having a non-configurable width, the stored memory word including the user data word and the subset of the stored memory word;
   generating ECC data based on the user data word and the subset of the stored memory word, the ECC data including a fixed number of bits; and
   writing the ECC data to the ECC portion of the RAM array at the user address.

2. The method of claim 1, wherein the writing the user data word and the writing the ECC data both occur in a single write cycle of the RAM array.

3. The method of claim 2, wherein the writing the user data word and the writing the ECC data utilize a single write port of the RAM array.

4. The method of claim 1, wherein the writing the user data word occurs in a first write cycle, and the writing the ECC data occurs in a second write cycle, of the RAM array, the second write cycle occurring at a different time from the first write cycle.

5. The method of claim 1, wherein the generating ECC data based on the user data word comprises generating a Hamming code for the user data word.

6. The method of claim 1, wherein the generating ECC data based on the user data word comprises generating two additional copies of the user data word.

7. The method of claim 1, further comprising reading the user data word from the configurable subset of the user data portion of the RAM array.

8. The method of claim 7, wherein the writing the ECC data to the ECC portion of the RAM array at the user address and the reading the user data word from the configurable subset of the user data portion of the RAM array occur during the same clock cycle.

9. The method of claim 1, wherein the programmable device is a programmable logic device (PLD).

10. The method of claim 9, wherein the PLD is a field programmable gate array (FPGA).

11. A programmable structure comprising a configurable random access memory (RAM) circuit, the RAM circuit comprising:
    first and second sets of data lines;
    first and second sets of address lines;
    a first array of user data memory cells coupled to the first and second sets of data lines and further coupled to the first and second sets of address lines;
    a second array of error correction code (ECC) memory cells coupled to the second set of data lines and the second set of address lines;
    a first write port coupled to the first sets of data and address lines, the first write port having a first plurality of configuration select input terminals, wherein the first write port stores user data in a configurable subset of the first array based on values supplied by the first plurality of configuration select input terminals;
    a second write port coupled to the second sets of data and address lines, wherein the second write port stores ECC data in the second array and further stores corrected data in the first and second arrays;
    a read port coupled to the first sets of data and address lines, the read port comprising a configurable select tree having a second plurality of configuration select input terminals, wherein the configurable select tree selects a configurable subset of data stored in the first array based on values supplied by the second plurality of configuration select input terminals; and
    an ECC generation and correction circuit coupled to the second sets of data and address lines and further coupled to provide the ECC data and the corrected data to the second write port.

12. The programmable structure of claim 11, further comprising an error detect terminal coupled to an output terminal of the ECC generation and correction circuit.

13. The programmable structure of claim 11, wherein the first plurality of configuration select input terminals is coupled to the second plurality of configuration select input terminals.

14. The programmable structure of claim 11, wherein:
    the ECC generation and correction circuit comprises:

means for reading user data from a first plurality of memory cells in the first array, the first plurality of memory cells being associated with a first address line in the second set of address lines, and means for generating ECC data corresponding to the user data; and the second write port comprises means for writing the ECC data to a second plurality of memory cells in the second array, the second plurality of memory cells being associated with the first address line.

15. The programmable structure of claim 14, wherein:

the ECC generation and correction circuit further comprises means for generating corrected data; and the second write port further comprises means for writing the corrected data to the first and second pluralities of memory cells.

16. The programmable structure of claim 11, wherein the ECC generation and correction circuit comprises:

means for successively reading user data from each address location in the first array, each address location being associated with a different address line in the second set of address lines;

means for successively generating ECC data corresponding to the user data for each address location; and means for successively writing the ECC data to each address location in the second array via the second write port.

17. The programmable structure of claim 11, wherein the programmable structure is a programmable logic device (PLD).

18. The programmable structure of claim 17, wherein the PLD is a field programmable gate array (FPGA).

* * * * *